(12) United States Patent
De Mol

(10) Patent No.: US 7,649,614 B2
(45) Date of Patent: Jan. 19, 2010

(54) METHOD OF CHARACTERIZATION, METHOD OF CHARACTERIZING A PROCESS OPERATION, AND DEVICE MANUFACTURING METHOD

(75) Inventor: Christianus Gerardus Maria De Mol, Son en Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/440,436

(22) Filed: May 25, 2006

(65) Prior Publication Data

US 2006/0279722 A1 Dec. 14, 2006

Related U.S. Application Data

(63) Continuation-in-part of application No. 11/149,434, filed on Jun. 10, 2005, now abandoned.

(51) Int. Cl.
*G03B 27/32* (2006.01)
(52) U.S. Cl. .......................... 355/77; 356/401
(58) Field of Classification Search .............. 355/53, 355/77; 356/401; 430/22
See application file for complete search history.

(56) References Cited

U.S. PATENT DOCUMENTS

| | | | |
|---|---|---|---|
| 5,252,414 A | 10/1993 | Yamashita et al. | 430/22 |
| 5,863,680 A | 1/1999 | Kawakubo et al. | 430/22 |
| 5,989,762 A | 11/1999 | Takaoka | 430/30 |
| 6,233,494 B1 * | 5/2001 | Aoyagi | 700/121 |
| 7,212,286 B2 * | 5/2007 | Hoshi | 356/401 |
| 2002/0102482 A1 | 8/2002 | Smith et al. | 430/22 |
| 2003/0158701 A1 | 8/2003 | Yasuda et al. | 702/179 |
| 2003/0204348 A1 * | 10/2003 | Suzuki et al. | 702/83 |
| 2004/0017574 A1 * | 1/2004 | Vuong et al. | 356/625 |
| 2004/0126004 A1 * | 7/2004 | Kikuchi | 382/141 |
| 2005/0031975 A1 | 2/2005 | Reuhman-Huisken et al. | |

FOREIGN PATENT DOCUMENTS

EP 0 794 465 A2 9/1997

(Continued)

OTHER PUBLICATIONS

English Translation of Korean Office Action issued for Korean Patent Application No. 10-2006-0051348, dated Jun. 27, 2007.

(Continued)

*Primary Examiner*—Peter B Kim
*Assistant Examiner*—Chia-how Michael Liu
(74) *Attorney, Agent, or Firm*—Pillsbury Winthrop Shaw Pittman LLP

(57) ABSTRACT

A system in which deformation of a substrate is monitored during processing of the substrate is described. In one embodiment, the distortion in the substrate is measured after each exposure and processing operation by comparing the position of a plurality of reference marks to values in a database. The substrate may be characterized by measuring positions on the substrate for a number of measurement fields and a number of measurement positions per field, calculating an estimated variance based at least on the number of measurement fields, the number of measurement positions per field, and a number of model parameters, and comparing the calculated estimated variance to a threshold amount to determine a status of the substrate.

20 Claims, 11 Drawing Sheets

FOREIGN PATENT DOCUMENTS

| | | |
|---|---|---|
| EP | 0 794 465 A3 | 3/2000 |
| EP | 1 477 857 A1 | 11/2004 |
| JP | 8-115869 A | 5/1996 |
| JP | 2001-257159 A | 9/2001 |
| JP | 2001-266142 A | 9/2001 |
| JP | 2003-289025 A | 10/2003 |
| JP | 2003-329608 A | 11/2003 |
| JP | 2004-343113 A | 12/2004 |

OTHER PUBLICATIONS

European Search Report issued for European Patent Application No. 06252778.3, dated Nov. 27, 2006.

Notice of Reasons for Rejection for Japanese Patent Application No. 2006-147519 dated Jun. 1, 2009.

* cited by examiner

METHOD OF CHARACTERIZATION, METHOD OF CHARACTERIZING A PROCESS OPERATION, AND DEVICE MANUFACTURING METHOD

RELATED APPLICATION

This application is a continuation-in-part application of U.S. patent application Ser. No. 11/149,434, filed Jun. 10, 2005, now abandoned the entire contents of which is hereby incorporated by reference.

FIELD

The present invention relates to method of characterization, methods of characterizing a process operation, and device manufacturing methods using a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

Manufacturing a typical device by a lithographic process typically includes a plurality of cycles of a variety of steps. These steps may include coating the substrate with a photosensitive material (or otherwise applying a photosensitive material to one or more surfaces of the substrate), projecting an image on the photosensitive material, developing the photosensitive material and processing the substrate, which can include covering the substrate in a new layer of material. One of the problems that may be encountered with the lithographic process is that successive layers are not accurately imaged on top of each other so that there is a so-called overlay error. In order to avoid proceeding onto the subsequent steps when an overlay error already exists which would be detrimental to the component's performance, after each cycle the overlay error may be measured. If the overlay error is too large then the most recent layer can be removed and that step repeated before proceeding onto the next step.

In order to reduce overlay error, substrates are generally provided with a plurality of reference marks so that the position of the substrate on a substrate table in a projection apparatus may be measured very precisely prior to the exposure operation. In this way it is possible to improve the accuracy of the exposure operation because the relative positions of the substrate, the previously applied patterned layer and the patterning device in the lithographic apparatus may be determined.

Another problem with multi-cycle lithographic processes is the deformation of the substrate which can occur with the application of particular layers and/or particular patterns. Deformation includes, for example, topographic 3-dimensional deformation, deformation of the reference marks (shape or depth) or variation of layer properties or thicknesses deposited on the substrate. Chemical mechanical polishing (CMP) is notorious for causing deformation of the substrate. With the use of substrates with a diameter of 300 mm or more, it is expected that substrate deformation may become an even more important factor. In order to reduce deformation, it may be desirable to keep the processes as uniform as possible over the whole area of the substrate. Deformation of the substrate may lead to errors in the imaging of the substrate resulting in the need to repeat a particular operation. Also, during the development of a process for a particular component manufactured by lithography, the process may be optimized to minimize, or at least keep within limits, the amount of substrate deformation. The reduction of overlay error or an error as a result of substrate deformation, or at least early detection of one or more of such errors, may lead to improved yield.

SUMMARY

According to an embodiment of the invention, there is disclosed a method of characterizing a substrate, the method comprising: measuring positions on the substrate for a number of measurement fields and a number of measurement positions per field; computing an estimated variance based at least on the number of measurement fields, the number of measurement positions per field, and a number of model parameters; and comparing the calculated estimated variance to a threshold amount to determine a status of the substrate.

According to an embodiment of the invention, there is disclosed a method of characterizing a batch of substrates, the method comprising: measuring positions on each substrate from each of a plurality of batches of substrates for a number of measurement fields and a number of measurement positions per field; computing an estimated variance for each batch based at least on the number of measurement fields, the number of measurement positions per field, and a number of model parameters; and comparing the calculated estimated variance to a threshold amount to determine a status of the batch.

According to an embodiment of the invention, there is disclosed a method of monitoring the quality of a model for measuring positions on a substrate comprising: selecting a parameter to be monitored, a degree of freedom and a desired confidence level; measuring positions on the substrate for a number of measurement fields and a number of measurement positions per field; computing an estimated variance based at least on the number of measurement fields and the number of measurement positions per field; determining a confidence interval for the parameter based on the estimated variance the degree of freedom, the desired confidence level and the estimated variance; comparing the confidence interval to a threshold value; and controlling a lithographic apparatus based on the comparing.

According to an embodiment of the invention, there is disclosed a device manufacturing method comprising: using a patterning structure to impart a beam of radiation with a pattern in its cross-section; projecting the patterned beam onto a target portion of a substrate to create a latent pattern; developing the latent pattern; processing the substrate; measuring relative positions of portions of the pattern on the substrate for a number of measurement fields and a number of measurement positions per field; computing an estimated variance based at least on the number of measurement fields, the number of measurement positions per field, and a number of model parameters; and comparing the calculated estimated variance to a threshold amount to determine a status of the substrate.

Other embodiments include device manufacturing methods and data storage media including sets of machine-executable instructions describing such methods.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
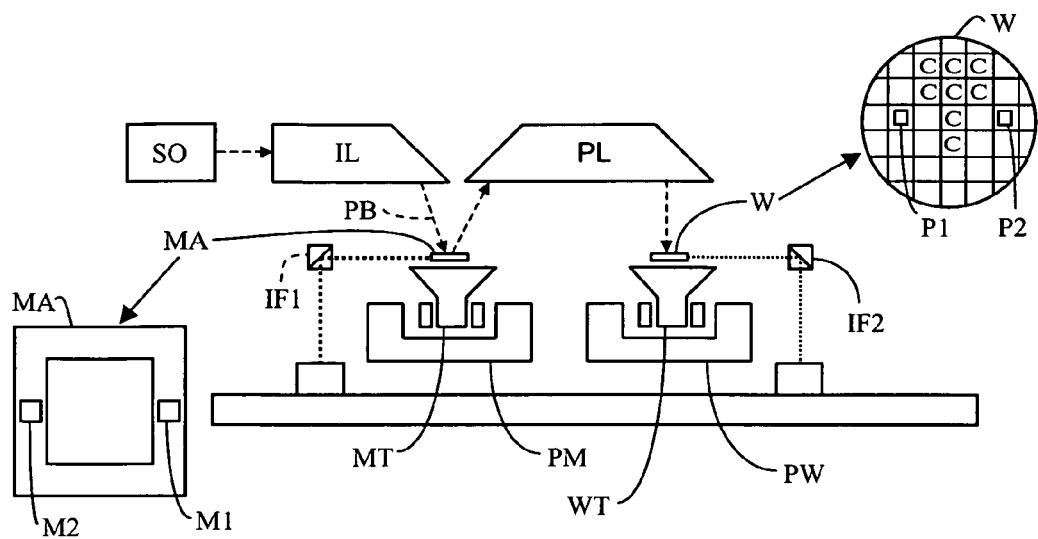
FIG. 1 depicts a lithographic projection apparatus according to an embodiment of the invention.

Embodiments of the present invention include device manufacturing methods which improve yield.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structure, the support structure may be a frame or table, for example, which may be fixed or movable as required and which may ensure that the patterning means is at a desired position, for example with respect to the projection system. Any use of the terms "reticle" or "mask" herein may be considered synonymous with the more general term "patterning structure."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more support structures). In such "multiple stage" machines the additional tables may be used in parallel, or preparatory operations may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In European Patent Application Publication No. EP 0 794 465 A2, a lithographic method is described in which an alignment correction value is derived from overlay measurements made on a selection of substrates from a lot and used in the exposure of other substrates in the same or a subsequent lot. In U.S. Patent Application Publication No. 2002/012482 A1, a description is provided of a method for manufacturing and using reference substrates in a fab to determine substrate stage registration performance. In U.S. Pat. No. 5,252,414, a description is provided of a method of evaluating a resist coating in which a second resist layer is applied on top of a first patterned resist layer. Overlay accuracy between patterns in the first and second resist layer gives a quantitative evaluation of the resist coating. In U.S. Pat. No. 5,863,680, a description is provided of a device manufacturing method in which information relating overlay errors between earlier process layers and exposure conditions is used to correct the alignment of subsequent layers.

FIG. 1 schematically depicts a lithographic apparatus according to a particular embodiment of the invention. The apparatus comprises:

an illumination system (illuminator) IL for providing a projection beam PB of radiation (e.g., UV or EUV radiation);

a support structure (e.g., a mask table) MT for supporting patterning structure (e.g., a mask) MA and connected to first positioning device PM for accurately positioning the patterning structure with respect to item PL;

a substrate table (e.g., a wafer table) WT for holding a substrate (e.g., a resist coated wafer) W and connected to second positioning device PW for accurately positioning the substrate with respect to item PL; and a projection system (e.g., a reflective projection lens) PL for imaging a pattern imparted to the projection beam PB by patterning structure MA onto a target portion C (e.g., comprising one or more dies) of the substrate W.

As here depicted, the apparatus is of a reflective type (e.g., employing a reflective mask or a programmable mirror array of a type as referred to above). Alternatively, the apparatus may be of a transmissive type (e.g., employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting structure for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the patterning device MA, which is held on the support structure MT. Being reflected by the patterning device MA, the projection beam PB passes through the lens PL, which focuses the beam onto a target portion C of the substrate W. With the aid of the second positioning device PW and position sensor IF2 (e.g., an interferometric device), the substrate table WT can be moved accurately, e.g., so as to position different target portions C in the path of the beam PB. Similarly, the first positioning device PM and position sensor IF1 can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device or devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
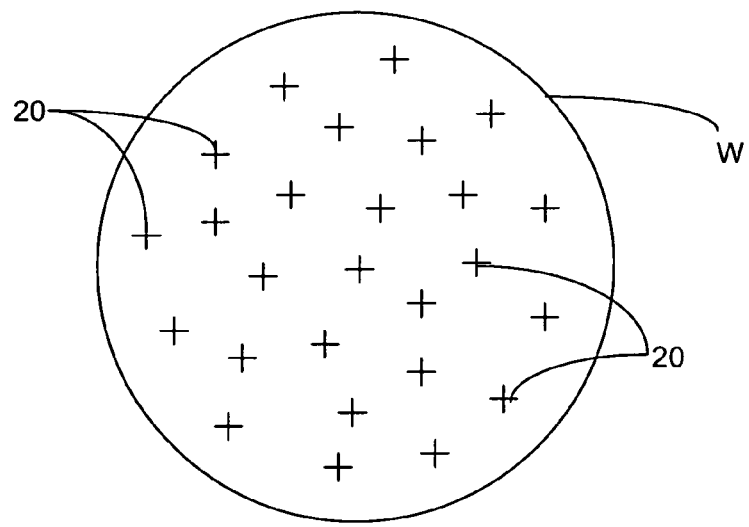
FIG. 2 depicts a substrate with a typical pattern of reference marks.

FIG. 2 illustrates, in plan, a substrate W with a plurality of reference marks 20 which have been applied on the upper surface. In a dual stage lithographic projection apparatus the number of reference marks 20 might be in the region of 25 per substrate W. There is plenty of time in the measurement operation when using such apparatus for the precise measurement of the relative positions of each of the reference marks 20 on the substrate W.

Figure 3:
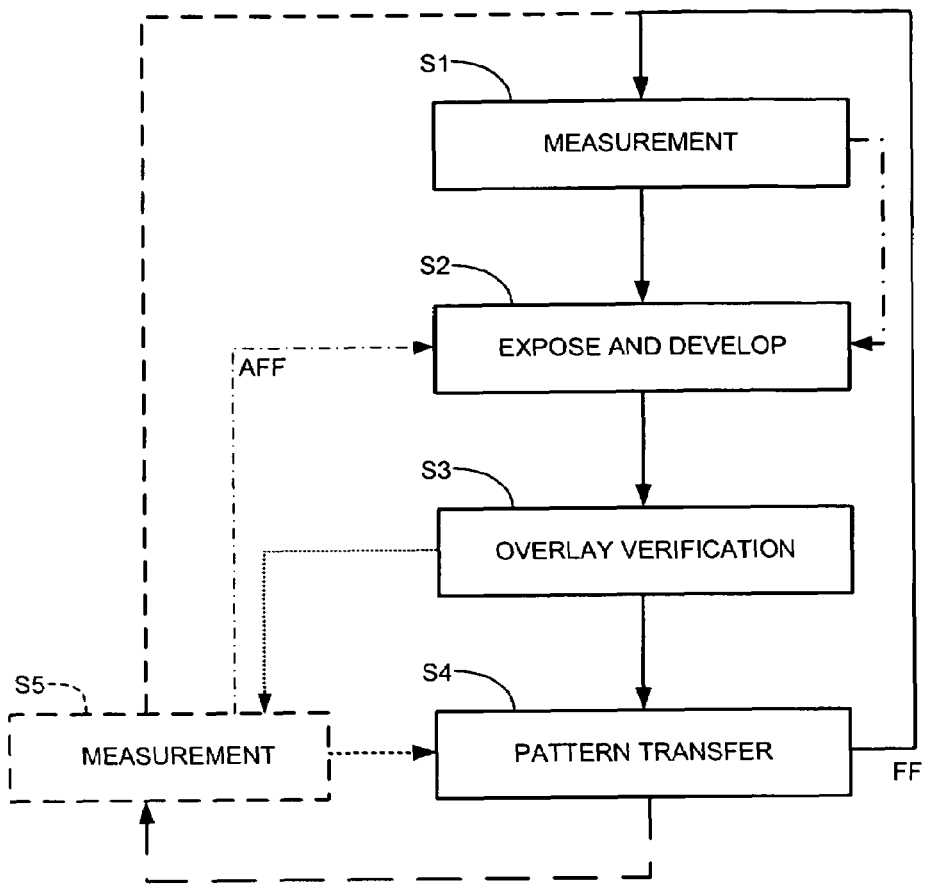
FIG. 3 is a schematic illustration showing various operations of a method according to an embodiment of the invention.

FIG. 3 illustrates the operations of an embodiment of the method. The first operation of the method is a measurement operation S1, in which the relative positions of each of some or all of the reference marks 20 on the substrate W are measured. This operation can be performed in the lithographic projection apparatus, where the position of the reference marks 20 may be measured in any case for substrate W to substrate table WT alignment and leveling measurement, or it can be performed in a separate machine. The machine used in the measurement operation S1 could be the same machine that is used for overlay verification which measures the alignment between two consecutive layers on the substrate W. This overlay verification operation S3 will be described later.

During the measurement operation S1 a measuring system measures the relative positions of the plurality of reference marks 20 on the substrate W under the control of a controller. A processor is used to compare the results of the measurement S1 with information/values in a database.

Several variations of the method are possible depending on the results of the comparison between the measured results with the information stored in the database. For example, an operator alerter may be activated if the comparison reveals that the substrate W is deformed beyond predetermined limits. Such an alerter may include, for example, a light or sound indicator, or a message on a computer monitor or control station. Alternatively or additionally, the result of the comparison may be used by the controller to control the subsequent exposure of the substrate W. In either circumstance, the result of the measurement operation and the result of the comparing operation may be automatically saved in the database to help build up a history of how the substrate deformation changes during its processing and added to the information. This is useful both as a history for that particular substrate as well as for use in comparing how different substrates have deformed over time.

Following the measurement operation S1 the substrate is exposed in a lithographic projection apparatus and is subsequently developed (operation S2 in FIG. 3). Usually the reference marks 20 are uncovered at the end of the exposure and development operation S2 (or may remain covered if visible through the overlying layers) such that further measurement may be performed using those reference marks 20, including overlay verification S3 in which the overlay accuracy is assessed.

The next operation, S4, is a pattern transfer operation which can involve the deposition of a layer on, or doping (by, for example, ion radiation) or etching of, areas of the substrate not covered by photosensitive material (i.e., removed during development). Before the next exposure in the lithographic projection apparatus the position and orientation of the substrate W may be measured using the reference marks 20 relative to the support structure which holds the patterning structure (which itself serves to pattern a projection beam generated by a radiation system to a desired pattern). The projection beam may be projected by a projection system onto a target portion of the substrate W.

In one embodiment a feed forward loop FF is used to control the exposure operation of the exposure and develop operation S2 to take into account the measured deformation and the result of the comparison in operation S1.

Following the exposure and development operation S2, an alignment measurement operation S3 is performed in which the alignment of two subsequent layers deposited on the substrate W during consecutive cycles is measured. This process ensures that, should the alignment of the latest layer to its preceding layer be unsatisfactory, that latest layer can be removed and a new layer deposited so that no unnecessary effort is expended in applying further subsequent layers to the substrate W even when the detected misalignment between layers would render such a substrate useless.

FIG. 3 shows an alternative or additional measurement operation S5 in which the positions of the reference marks 20 are measured relative to each other and the results are compared to information in a database. It may be convenient in certain types of apparatus to perform the alignment measurement operation S3 and the measurement operation S5 at the same time so as to free up the lithographic projection apparatus for exposing substrates which have already been measured (shown in dotted lines). Alternatively, the measurement operation S3 may be performed after operation S4 but independently of operation S5. A feed forward control of the exposure operation S2 is also possible (labeled AFF in FIG. 3). It may then be sufficient to measure only a few of the reference marks 20 in operation S1 for aligning the position of the substrate W relative to the patterning device in the projection apparatus.

The measurement, exposure, development, alignment measurement and pattern transfer operations S1, S2, S3, S4 form a cycle which may be performed a plurality of times as required according to the desired structure on the substrate W. The results of each measurement operation S1, S5 may be automatically stored in the database by an automatic storer. In this way a history of deformation of the substrate W may be built up during its processing. This allows process engineers to identify which of the plurality of exposure, development and process operations S2, S4 results in unallowable amounts of deformation of the substrate W.

The first measurement operation before the substrate W has been exposed may be performed without a comparison to a database. In this circumstance, no deformation of the substrate W would have occurred due to exposure or process because no exposure or process has yet occurred.

In some cases it may be advantageous in the comparing operation to only compare values stored in the database which come from substrates W of the same batch of substrates W. It may be that substrates of different batches react in differing ways to given exposure, development and processing operations, such that only values from the same batch of substrates would form a valid comparison. The activation of the operator alerter could indicate to the operator either a drift in the settings of the lithographic projection apparatus or a substrate W which has been subjected to too large a deformation.

The values in the database may be values of previous measuring operations S1, S5 on the particular substrate W under consideration. If a comparison shows deformation between cycles, or overall, beyond a predetermined value, the operator alerter may be activated or the exposure operation S2 controlled by the controller to account for the deformation.

The controller can control the exposure operation S2 to account for position offset or non-orthogonal deformation (automatically or by alerting an operator to make a manual correction) or even higher order deformations (i.e., non-linear deformations).

Figure 4:
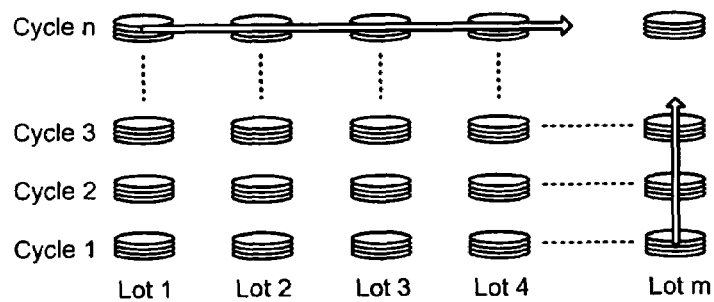
FIG. 4 shows the use of cycle fingerprint data and substrate data to make predictions.

FIG. 4 shows how fingerprint data relating to a particular cycle (e.g., cycle n), averaged over a number of lots and substrate data averaged over the substrate of a given lot (e.g., lot m), can be used to predict the results of the particular cycle on the given lot.

A statistical method of identifying discrepant substrates uses linear regression analysis based on the following model:

$$\Delta = \beta_0 + \beta_1 x + \beta_2 y + \text{residual}$$

where $\Delta$ is the difference between a measured position and the expected position in (x,y,z). In general the model fit is not perfect, which will result in a residual for each measurement. This residual can be thought of to consist of two components: a so-called non-correctable component and a random component. The non-correctable component is a constant that, by definition, cannot be described by the model applied. The random component, which may also be referred to as measurement noise, consists of real measurement-device related noise and, for example, of random variation in the quality of the measurement targets.

A variance ($\sigma^2$) of the measurement noise can be used as a measurement of a reliability of the estimated model parameters. Furthermore, the noise level also affects the quality of the measurements. As a result, by estimating the variance and determining a sensitivity of the variance to changing conditions, a useful metric can be obtained.

In practice multiple linear regression is applied to a number of entities, where an entity might be a substrate containing multiple alignment measurements of multiple substrates per batch or lot. Therefore modeling substrate data will result in a residual for each measurement position. By averaging the residuals for each measurement over all substrates an estimate is obtained of the non-correctable error of that position. In the event of a process change, an error such as a particle on the substrate table, or a layer-to-layer interaction, the pattern of the non-correctable errors will change and can be detected.

In a particular embodiment, an estimate of the variance of the measurement noise can be obtained. For example, this quantity may be estimated by summing residual-variances from each of a number of measurement positions (n) in each measurement field (m), and dividing the result by n−(k+1), where the quantity k+1 is a number of parameters used in the model. Defining $res_{i,j}$ as being a residual at the position i in the field j a formula for estimating $\sigma^2$ is as follows:

$$\hat{\sigma}^2 = \frac{1}{n-k-1} \sum_{i=1}^{n} \left( \frac{1}{m-1} \sum_{j=1}^{m} \left( res_{i,j} - \frac{1}{m} \sum_{k=1}^{m} res_{i,k} \right)^2 \right)$$

The reliability or confidence interval of the estimated standard deviation (the square root of the estimated variance) can be expressed as follows:

$$\frac{\hat{\sigma}}{\sigma} = 1 \pm z_{\alpha/2} \cdot c$$

wherein $\hat{\sigma}$ is the estimated standard deviation, a represents the confidence level (e.g., $\alpha$=0.05 for 95% confidence level), $z_{\alpha/2}$ is the z value for which the probability $P(z \leq z_{\alpha/2})$ equals $1-\alpha/2$, which probability can be obtained from the standard normal distribution table, and c is determined by $$c = \frac{1}{\sqrt{2(m-1)(n-k-1)}}.$$

The above expressions hold for situations in which the random component is nearly normal. However, as the distributions become more platykurtic (that is, the distributions vary from normal, but kurtosis is relatively small, where kurtosis is a parameter derived from the mean and $\sigma$), then c tends to be smaller and the reliability defined above tends closer to 1.

By way of example, for 44 measured fields, 25 points per field and three model parameters, c is approximately equal to 0.023.

By using a method according to at least one embodiment of the invention in a dual stage lithographic projection apparatus wherein measurement of a first substrate is performed concurrently with the exposure operation on a second substrate, substrate deformation during manufacture can be monitored without a reduction in throughput because the operation of measuring the relative positions of the reference marks takes less time than the exposure operation and in some cases needs to be carried out in any case in order to gauge the positioning of the substrate relative to the protocol which is used in the exposing operation. Such a method may be used to allow the effects of process operations carried out on other tools to be monitored in the lithographic apparatus used for patterning.

If the result of the comparison is greater than a predetermined maximum, an operator may be alerted. This can improve yield for the customer as substrates which have deformed beyond a certain amount will be rejected before further exposing, developing and processing operations are carried out. Furthermore, during development of a multi-operation process for the manufacture of a device using lithography, those operations which cause unacceptable substrate deformation can be identified at an early stage. Embodiments of the invention may be used to alert a user of the apparatus if the apparatus drifts such that sub-standard substrates are being manufactured. Note that in the following examples of embodiments of the invention, data shown are simulated and/or modeled and do not necessarily reflect actual measuring and testing.

EXAMPLE 1

Figure 5A:
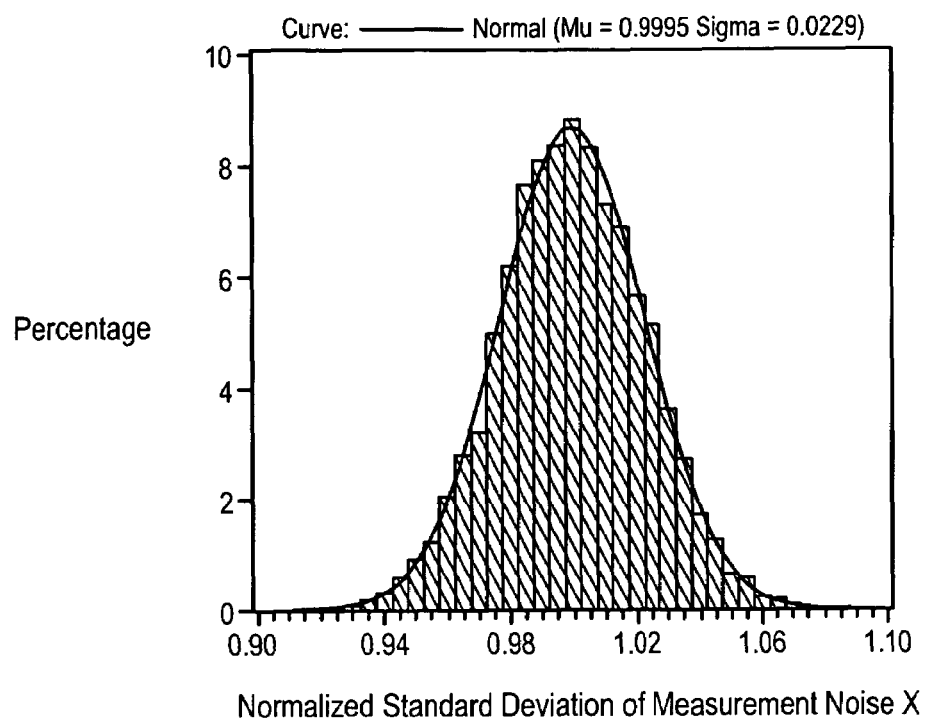
FIGS. 5a and 5b are distributions of measurement noise for a simulated experiment according to an embodiment of the present invention.
Figure 5B:
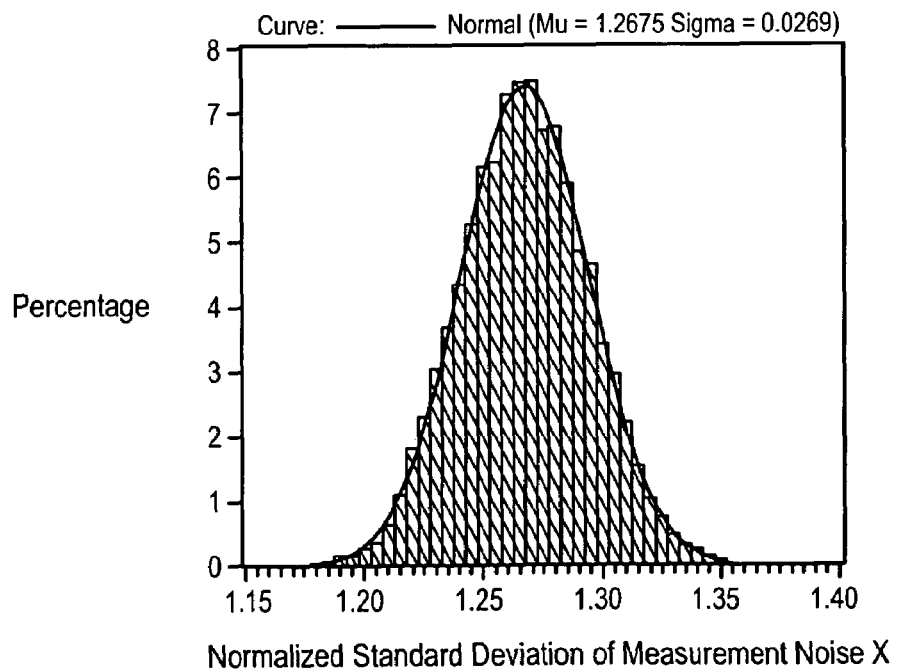

As shown in FIGS. 5a and 5b, an estimated variance method of an embodiment of the present invention can be quite sensitive to minor changes in measured quantities. FIG. 5a illustrates a batch of 10,000 simulated experiments in which each experiment includes the measurement of 44 fields, 25 measurement points per field and three model parameters. As may be seen in the Figure, the standard deviation $\sigma$ is approximately 1 nm and c is approximately 0.0229. In FIG. 5b, the batch has been modified to include a 25 nm offset error in each experiment. As may be seen from the Figure, the second batch has $\sigma$ approximately 1.26 nm and c is approximately 0.0269. As a result, the two batches can be quite easily discerned and in fact, the two curves do not overlap at all. Thus, this example demonstrates that the resolution of $\hat{\sigma}$ is adequate for resolving test results, presuming appropriate test design (i.e., selection of appropriate numbers of fields, points per field and model parameters).

EXAMPLE 2

Figure 6A:
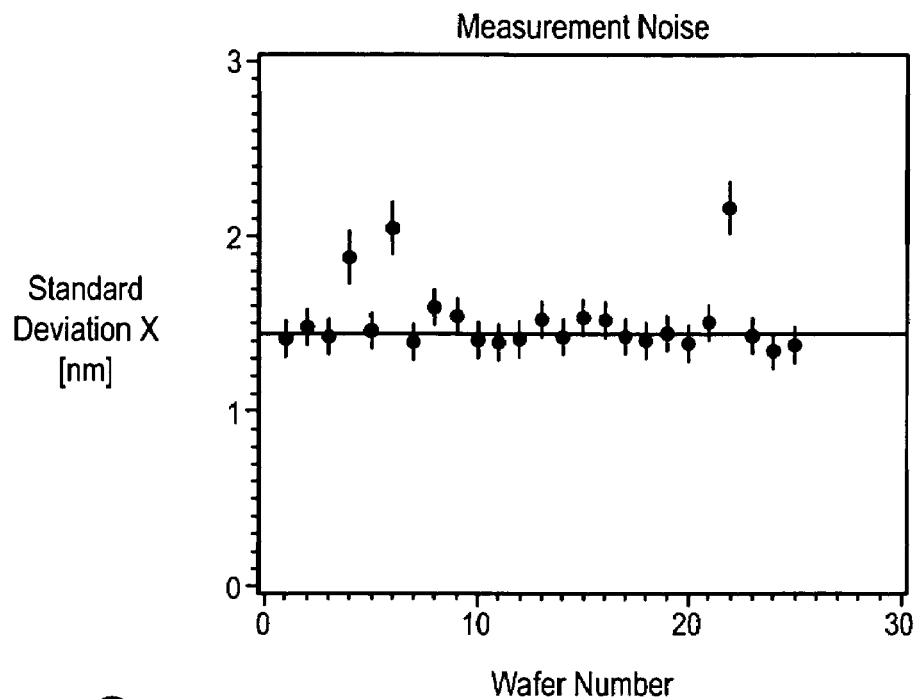
FIGS. 6a and 6b are standard deviation plots of measurement noise for a simulated experiment according to an embodiment of the present invention.
Figure 6B:
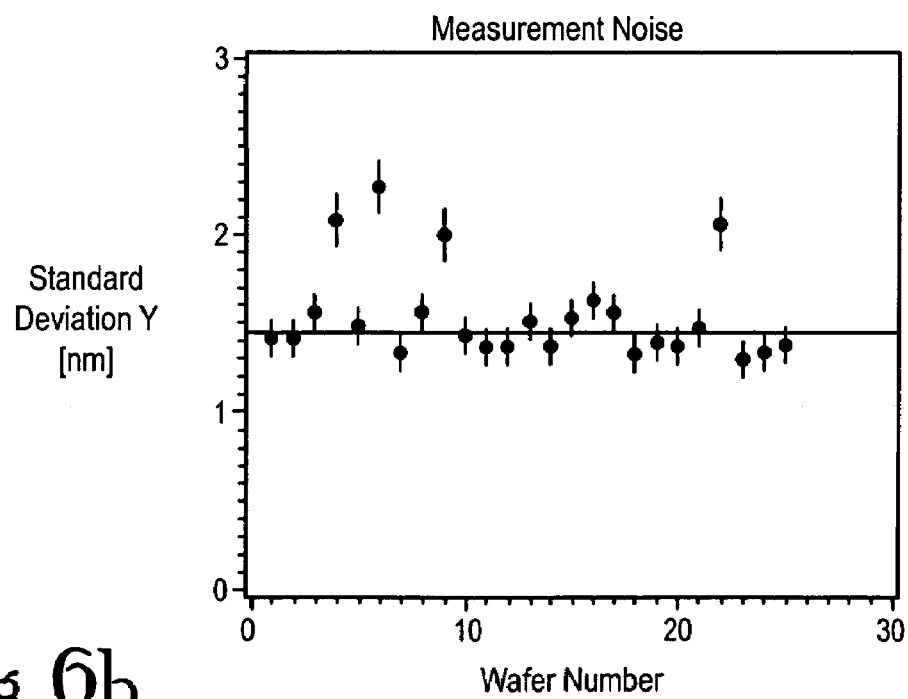

FIGS. 6a and 6b illustrate the standard deviation in X and Y, respectively, for a batch of 25 substrates for which 44 fields have been measured at 25 points per field in accordance with an embodiment of the present invention. For each point plotted in FIGS. 6a and 6b, an error bar is indicated which corresponds to 3$\sigma$, or a 99.7% confidence interval. Substrates 4, 6 and 22 appear from the X plots to be well outside the norm, while substrates 4, 6, 9, and 22 are well outside the norm on the Y plots. These findings are confirmed by the residual plots shown in FIGS. 7a and 7b.

Figure 7A:
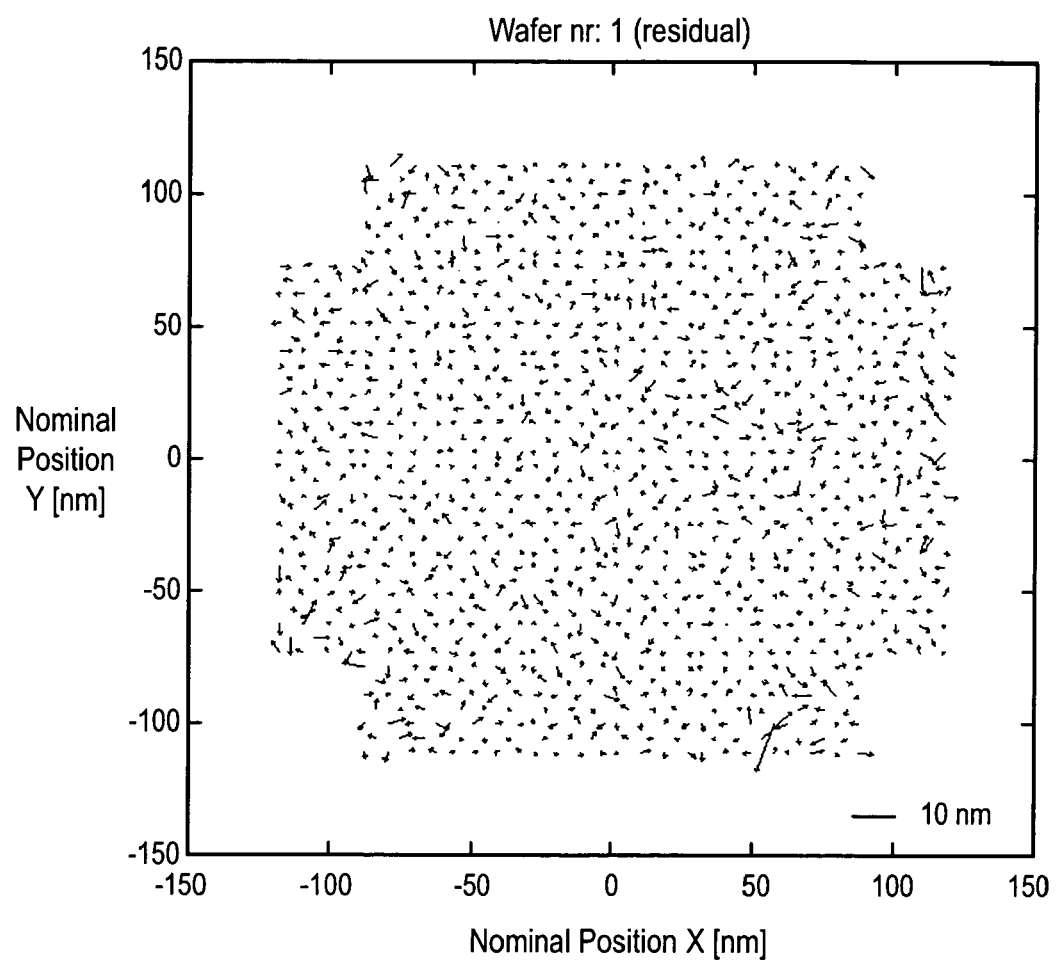
FIGS. 7a and 7b are residual plots for substrates from the group of FIGS. 6a and 6b.
Figure 7B:
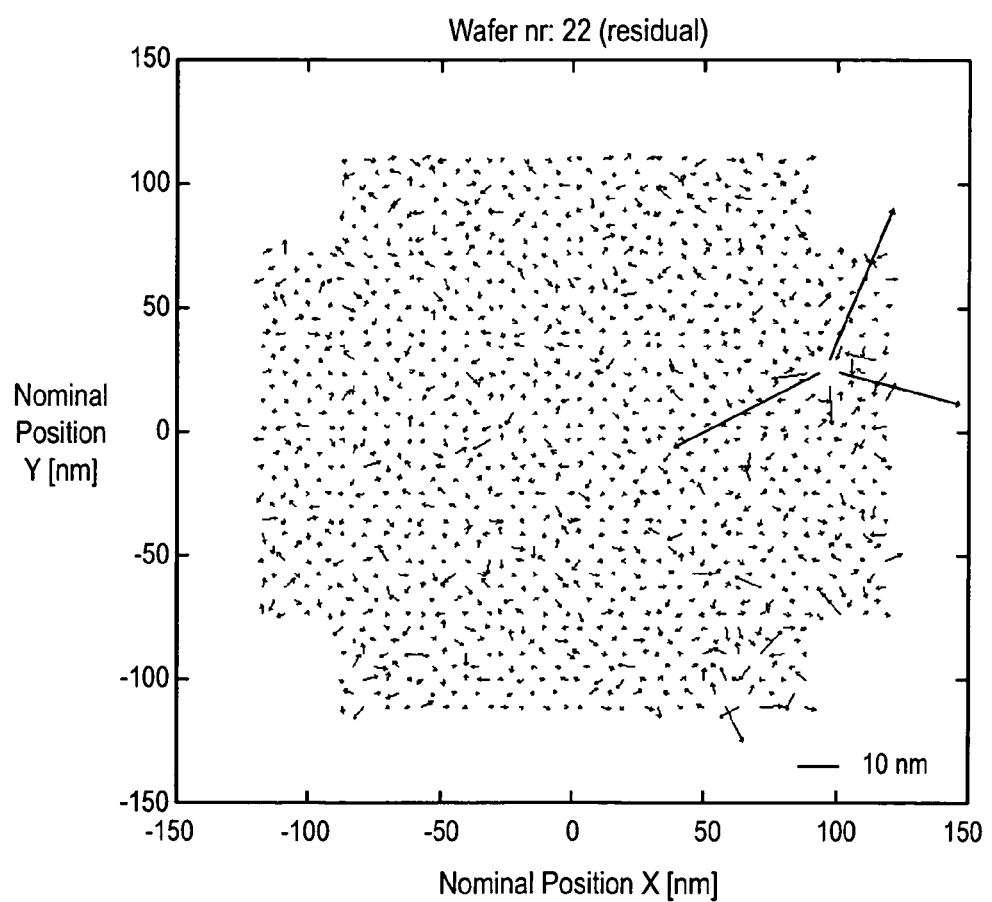

FIG. 7a illustrates a residual plot for substrate 1. As can be seen, the residual vectors on substrate I are relatively short, indicating good overlay performance. In contrast, FIG. 7b illustrates a similar plot for substrate 22. As can be seen, in the region of X=100 nm and Y=25 nm, there is a discontinuity which may be, for example, a contamination spot on the substrate or an overlay problem of other origin. In either case, the metric shown in FIGS. 6a and 6b can quite easily quantitatively differentiate the good substrate 1 from the bad substrate 22 and provide an appropriate process feedback to an operator or to a computer controller.

EXAMPLE 3

Figure 8A:
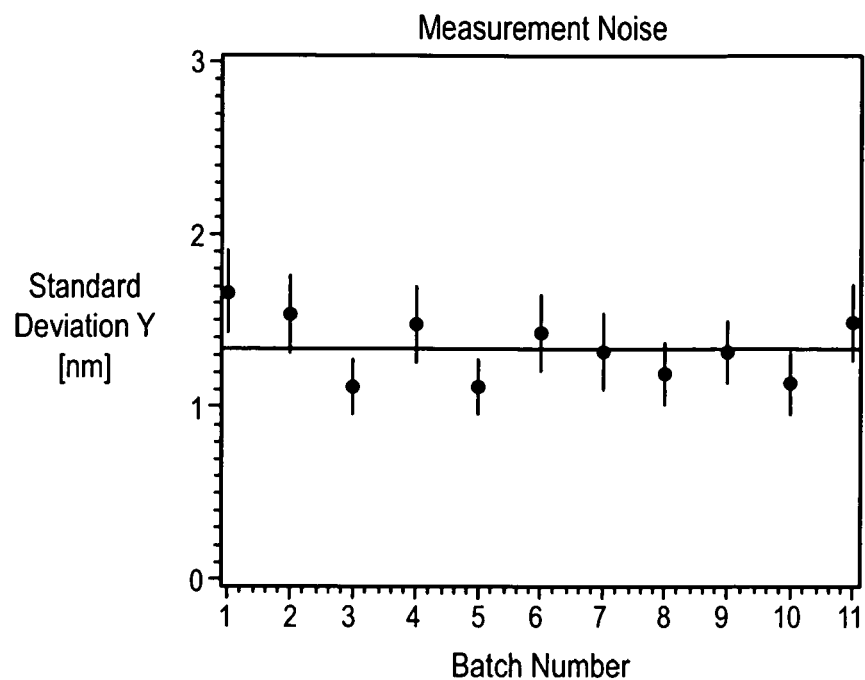
FIGS. 8a and 8b are plots of simulated measurement noise for batches of substrates being measured and analyzed in accordance with an embodiment of the present invention.
Figure 8B:
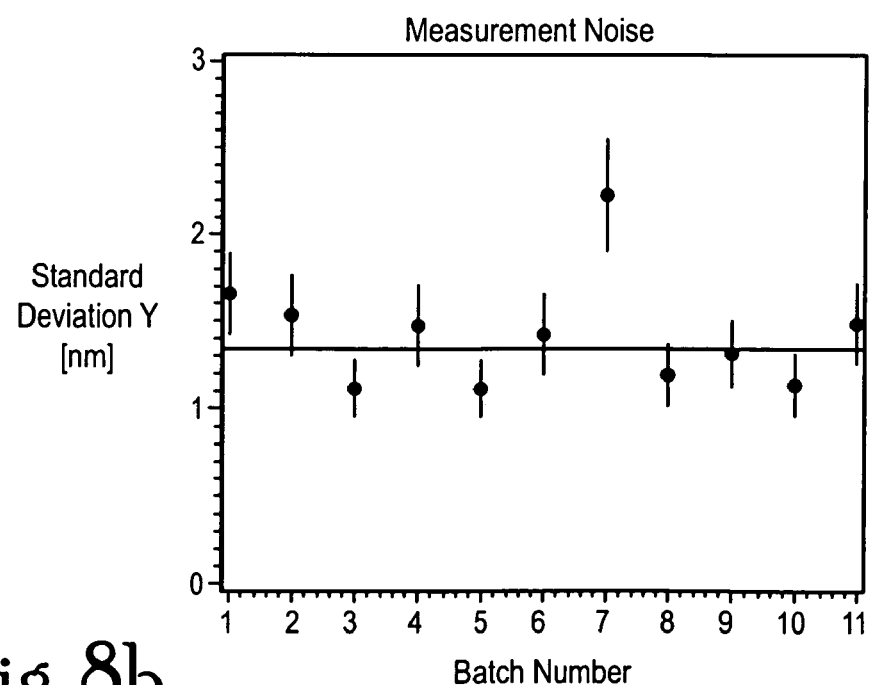

In an alternate embodiment, the present invention can be applied in a production environment. In this environment substrate alignment can be compared with measuring and modeling an overlay field and a batch consisting of multiple substrate alignments can be compared with an overlay substrate. Thus, measurement noise per batch can be estimated. In order to facilitate this analysis, the alignment marks measured should be consistent from substrate to substrate. As shown in FIG. 8a, for 11 batches of 25 substrates each and using 12 scribeline primary mark pairs (SPM pairs), selecting a three parameter model, and setting c=0.048, the values (within a confidence interval) are within about 0.1 nm of a best fit line. In contrast, as shown in FIG. 8b, a 30 nm offset added to one mark of one substrate in batch number 7 allows that batch to be clearly and easily distinguished from the others as it lies about 0.5 nm from the line representing a mean value for the 11 batches.

One type of production flaw would be the presence of a particle on a chuck of the substrate table. Such a particle would tend to result in a systematic variation in the substrate alignment, thereby reducing the effectiveness of the variance-based analysis described herein. However, by tracking changes in the systematic variations, one could, in theory, determine the source of those errors or monitor changing process conditions.

EXAMPLE 4

The quality of the model itself can be monitored using an embodiment of the present invention. In particular, for a given parameter $\beta_i$, there can be defined a confidence interval, $\hat{\beta}_i \pm t_{v,\alpha/2} \hat{\sigma}_{\hat{\beta}_i}$, wherein the standard error $\hat{\sigma}_{\hat{\beta}_i}$ of the estimated parameter is a function of $\hat{\sigma}$, the number of measurement points per field and the position of those points (in X and Y). The other coefficient of the confidence interval, $t_{v,\alpha/2}$ is obtained from either a table or calculator for t-distribution and varies according to the degree of freedom (v) and the desired confidence level ($\alpha$). By way of example, for a 95% confidence level and a large number of points per field, $t_{v,\alpha/2}$ approximates 2 (i.e., the confidence interval is about twice the standard error). Using the confidence limits ($\pm t_{v,\alpha/2} \hat{\sigma}_{\hat{\beta}_i}$) it can be determined whether the estimated parameter is statistically equal to (or unequal to) zero, which information could be used, for example, for updating machine constants in the lithography device.

Thus, given an accurate estimate or measurement of the measurement noise, the confidence interval of the parameter $\beta_i$ is obtained. Knowing the confidence intervals of the various parameters can allow for certain of the parameters to be, for example, discarded as unreliable or may lead, as noted above, to the determination that systematic errors should be investigated and/or machine constants altered.

Furthermore, a standard deviation can be calculated for each parameter based on estimation results per field. If, in making this calculation, a significant deviation from the corresponding standard error is noted, this information can be used to determine whether there is another significant mechanism for causing variance. For example, a random exposure error would produce an elevated standard deviation relative to the expected value of the standard deviation due to measurement noise.

EXAMPLE 5

Using another embodiment of the present invention, substrate map data may be qualified. In this embodiment, as with the foregoing embodiments, a number of measurements are taken per field. The fields measured may correspond to exposure fields of the lithography device, but this is not necessary. Additionally, the layout of the marks within each field should be consistent. These constraints ensure that non-correctable errors are substantially constant from field to field, ensuring that $\hat{\sigma}$ is a valid metric for the intended purpose.

Figure 9:
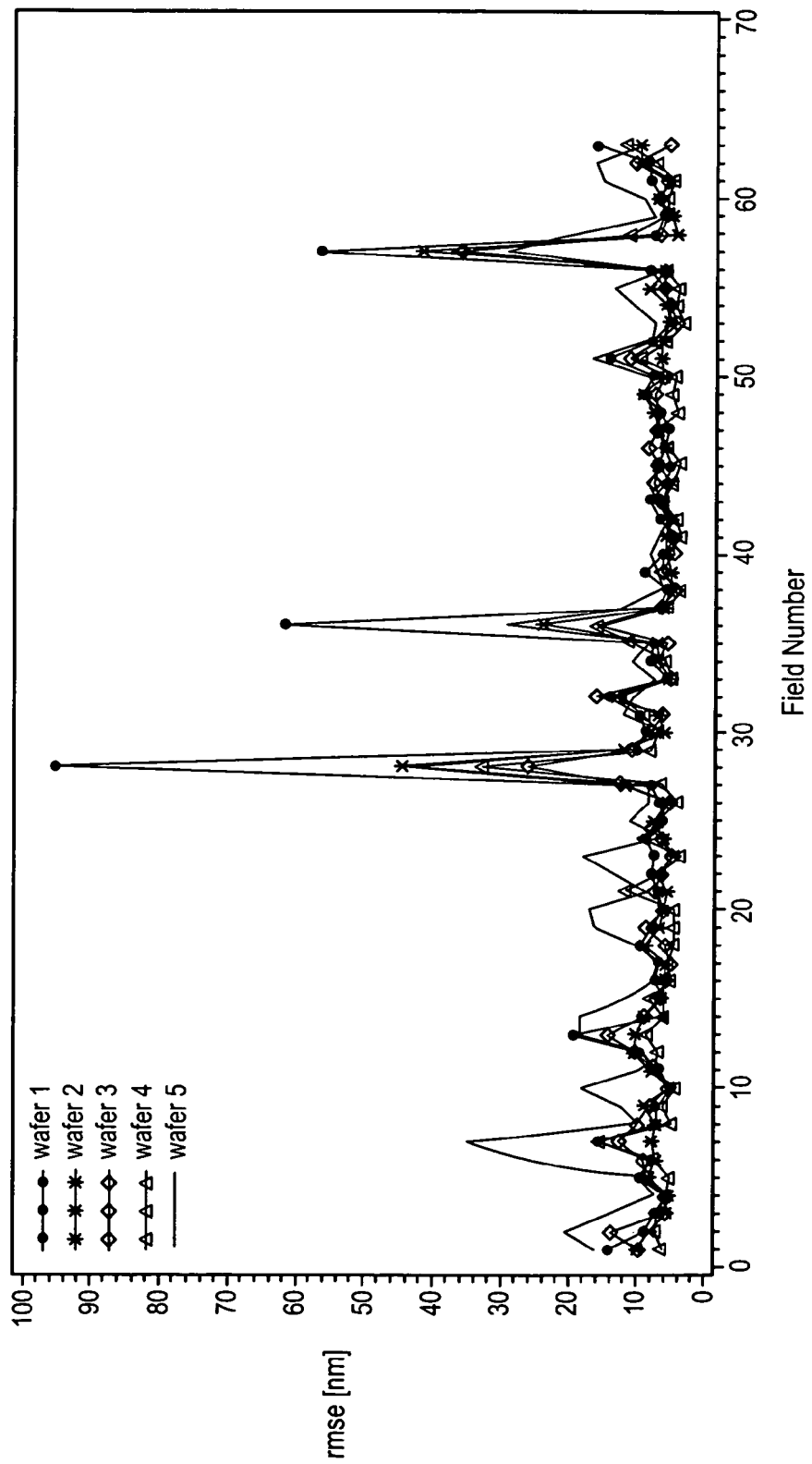
FIG. 9 is a plot of simulated root mean squared error for a number of fields being measured and analyzed in accordance with an embodiment of the present invention.
Figure 10:
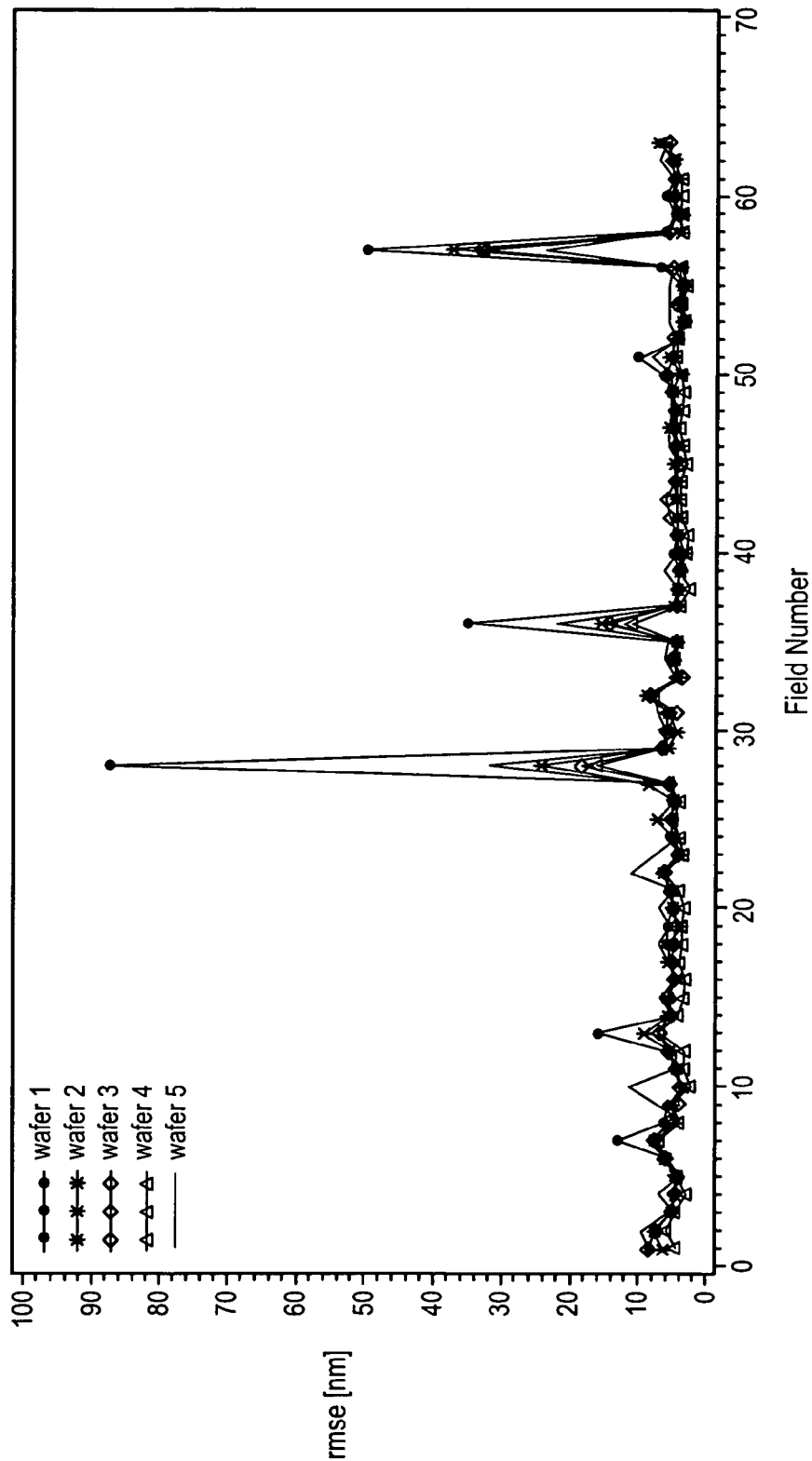
FIG. 10 is a plot of simulated root mean squared error for a number of fields being measured and analyzed in accordance with an extended model embodiment of the present invention.
Figure 11:
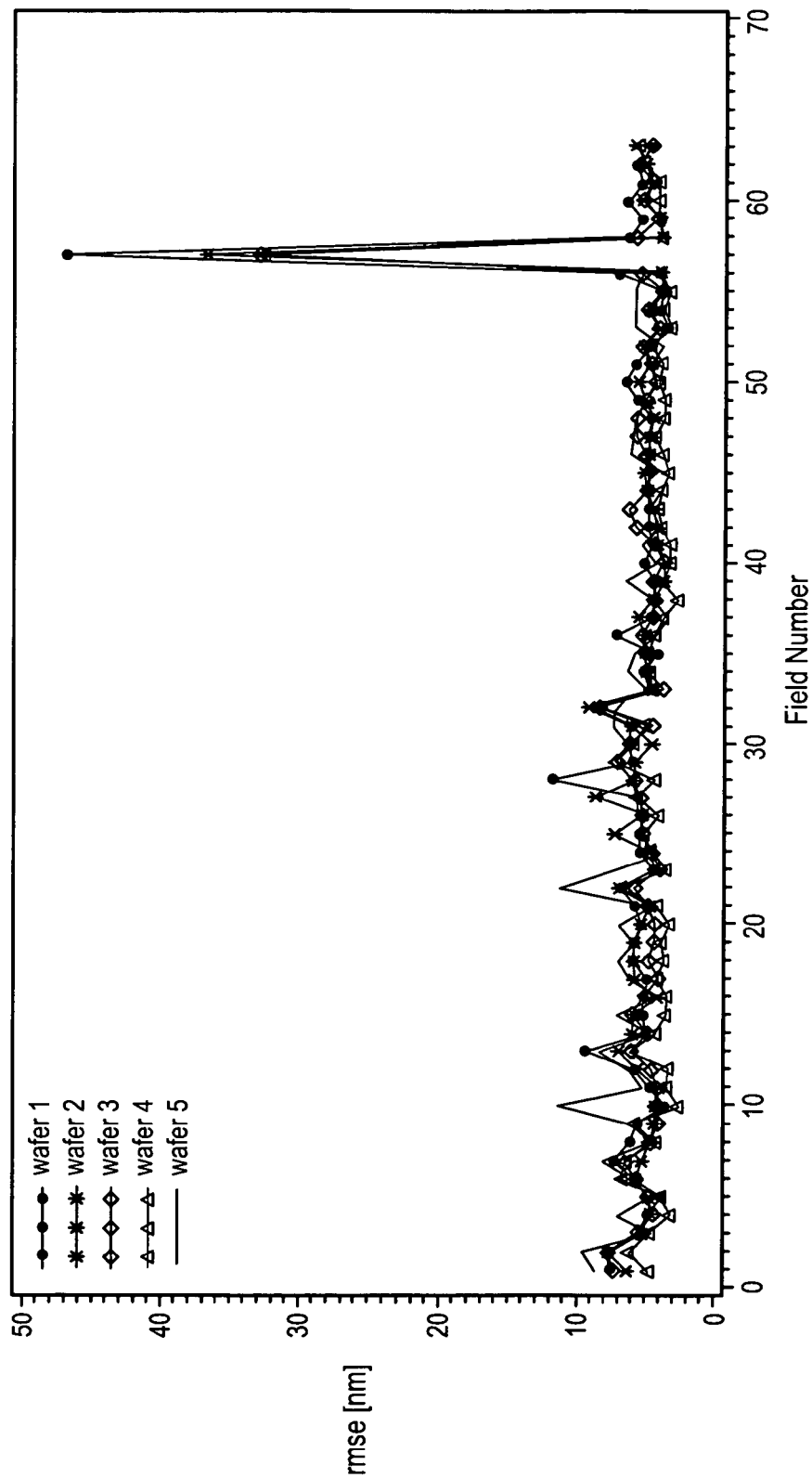
FIG. 11 is a plot of simulated root mean squared error for a number of fields being measured and analyzed in accordance with an embodiment of the present invention.
Figure 12:
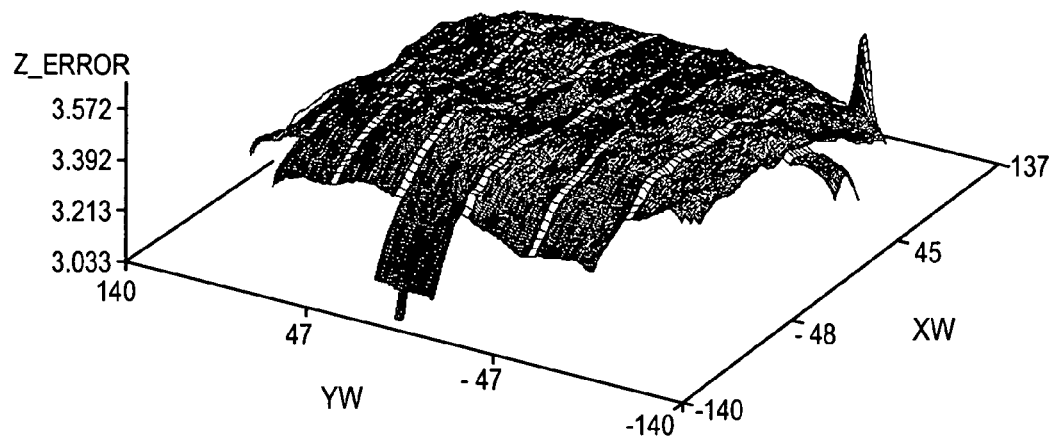
FIG. 12 is a substrate map of the substrate measured in FIGS. 9-11.

One possible solution to the problem of variance of non-correctable errors is an extension of the regression model by using residual analysis. FIG. 9 provides an example in which five substrates are measured on a common substrate table. The root mean squared error $$rmse = \sqrt{\frac{\sum_{i=1}^{n}(\Delta_i - \hat{\beta}_0 - \hat{\beta}_1 x_i - \hat{\beta}_2 y_i)^2}{n-3}}$$

in nm is plotted on the y-axis of the graph of FIG. 9. As may be seen in the plot, fields 7, 28, 36 and 57 each appear to have large irregularities. Once those fields are removed, new mean-residuals can be calculated taking into account quadratic and cross terms in the regression model thereby tending to remove the non-correctable errors in accordance with $\Delta = \beta_0 + \beta_1 x + \beta_2 y + \beta_3 x^2 + \beta_4 y^2 + \beta_5 xy +$ residual. FIG. 10 shows the same data plotted in accordance with the extended model. As may be seen, the data is generally smoother, the large irregularities stand out better than in FIG. 9, and the average value is smaller than in FIG. 9. In the present example, the largest irregularity, field 28, relates to a substrate identification mark. If the geometry of the scanned area is altered to avoid this mark, for example by restricting the radius scanned to, e.g., 140 mm, then the data become even more uniform. As can be seen in FIG. 11, with that change, a single large irregularity stands out from the rest at field 57. FIG. 12 is a substrate map that includes field 57, which can be seen in the upper right-hand corner of the Figure and is indicated generally at 100, where a 250 nm high focus spot is located. As for the previous examples, the method of an embodiment of the present invention allows for an easily discerned indicator that there is an error in a particular field. As mentioned previously, this determination can then allow an operator or a control system to investigate further to determine possible sources for the error, or to control the lithography process to take it into account.

Figure 13:
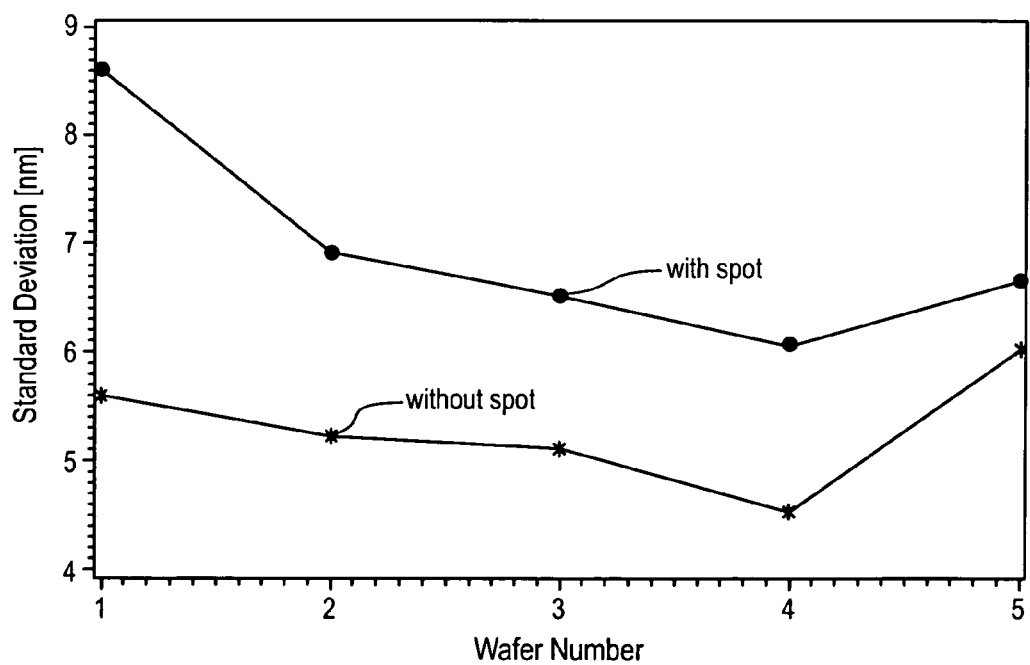
FIG. 13 illustrates measurement noise for the substrate measured in FIGS. 9-12.

FIG. 13 illustrates the measurement noise with and without the focus spot (upper and lower lines respectively). The difference in standard deviations is due in part to the height of the spot and in part to other, generally smaller, irregularities.

The information measured may comprise any kind of data relating to the substrate in general and/or to the particular layer of concern, as well as statistical measures. For example, the information may comprise raw position data; raw sensor data indicative of the substrate markers; and/or calculations from the data, such as magnification, translation, rotation or differences of individual measurements with respect to a reference grid described by parameters.

If the information stored in the database includes results of previous measuring operations, it is possible to accept or reject a substrate dependent on the deviation from the average measurement results or to highlight a change in processing conditions or a problem with the apparatus or processing conditions. In an embodiment, in such a case the information include results of previous measuring operations on substrates of the same batch of substrates so that it is known that those substrates have all undergone the same processing. Of course, other comparisons may be made. For example, the information in the database used for the comparison may be values from the same layer in a different batch of substrates. A batch or lot is a set of substrates subjected to the same operations.

A method according to an embodiment of the invention comprises the operation of automatically storing the result of the measuring and/or comparing operations in the database so that a history of results is saved. This may be useful as a diagnosis tool for engineers investigating a particular process with a view to optimizing yield.

It is also possible to control the exposing operation dependent on the results of the comparing operation of the preceding cycle. Thus, the exposing operation can be controlled to take account of the deformation of the substrate which has been measured, thereby to ensure that the exposing operation exposes the substrate in such a way to account for the deformation present in the substrate.

While specific embodiments of the invention have been described above, it will be appreciated that the invention may be practiced otherwise than as described. Embodiments of the invention also include computer programs (e.g., one or more sets or sequences of instructions) to control a lithographic apparatus to perform a method as described herein, and storage media (e.g., disks, semiconductor memory) storing one or more such programs in machine-readable form. The description is not intended to limit the invention.

What is claimed is:

1. A method of characterizing a substrate, the method comprising:
    measuring positions on the substrate for a number of measurement fields and a number of measurement positions per field;
    calculating an estimate of a statistical variance based at least on the number of measurement fields, the number of measurement positions per field, and an amount of different parameters of a numerical model for identifying a discrepant substrate, wherein calculating the estimate of the statistical variance does not involve actually calculating the statistical variance; and
    comparing the calculated estimated statistical variance to a threshold amount to determine a status of the substrate.

2. The method of claim 1, further comprising determining the threshold amount by performing the measuring and calculating for a plurality of substrates to determine a plurality of respective estimated statistical variances, and wherein the comparing comprises comparing one of the respective estimated statistical variances to an average estimated statistical variance of the plurality of substrates.

3. The method of claim 2, further comprising calculating a confidence interval for each estimated statistical variance, and wherein the comparing further comprises adding and subtracting the confidence interval to the one of the respective estimated statistical variances to produce an estimated statistical variance range and comparing the estimated statistical variance range to the threshold amount.

4. The method of claim 1, further comprising:
    when the calculated estimated statistical variance exceeds the threshold amount, taking an action selected from the group consisting of: producing an alarm signal, changing a process variable, further inspecting a corresponding substrate or discarding the corresponding substrate.

5. The method of claim 1, wherein the positions measured correspond to positions of structures printed on the substrate in a lithographic production process.

6. The method of claim 5, wherein the structures comprise alignment marks.

7. The method of claim 5, wherein the structures comprise portions of a microelectronic device.

8. The method of claim 7, wherein the microelectronic device is one or more devices selected from the group consisting of an integrated circuit, an integrated optical system, a magnetic domain memory, a liquid crystal display, or a thin film magnetic head.

9. A method of characterizing a batch of substrates, the method comprising:
    measuring positions on each substrate from each of a plurality of batches of substrates for a number of measurement fields and a number of measurement positions per field;
    calculating an estimate of a statistical variance for each batch based at least on the number of measurement fields, the number of measurement positions per field, and an amount of different parameters of a numerical model for identifying a discrepant substrate, wherein calculating the estimate of the statistical variance does not involve actually calculating the statistical variance; and
    comparing the calculated estimated statistical variance to a threshold amount to determine a status of the batch.

10. The method of claim 9, wherein the threshold amount is a mean value of the estimated statistical variances for the batches.

11. The method of claim 10, wherein the comparing comprises comparing the estimated statistical variance for each batch plus or minus a confidence interval to the threshold amount.

12. The method of claim 10, further comprising identifying any batch for which the estimated statistical variance is different from the threshold amount by more than a selected confidence interval.

13. The method of claim 9, further comprising:
    when the calculated estimated statistical variance exceeds the threshold amount, taking an action selected from the group consisting of: producing an alarm signal, changing a process variable, further inspecting a corresponding substrate or discarding the corresponding substrate.

14. A method of monitoring the quality of a model for measuring positions on a substrate comprising:
    selecting a parameter to be monitored, a degree of freedom and a desired confidence level;
    measuring positions on the substrate for a number of measurement fields and a number of measurement positions per field;
    calculating an estimate of a statistical variance based at least on the number of measurement fields, the number of measurement positions per field, and an amount of different parameters of a numerical model for identifying a discrepant substrate, wherein calculating the estimate of the statistical variance does not involve actually calculating the statistical variance;
    determining a confidence interval for the parameter based on the degree of freedom, the desired confidence level and the estimated statistical variance;
    comparing the confidence interval to a threshold value; and
    controlling a lithographic apparatus based on the comparing.

15. A device manufacturing method comprising:
   using a patterning structure to impart a beam of radiation with a pattern in its cross-section;
   projecting the patterned beam onto a target portion of a substrate to create a latent pattern;
   developing the latent pattern;
   processing the substrate;
   measuring relative positions of portions of the pattern on the substrate for a number of measurement fields and a number of measurement positions per field;
   calculating an estimate of a statistical variance based at least on the number of measurement fields, the number of measurement positions per field, and an amount of different parameters of a numerical model for identifying a discrepant substrate, wherein calculating the estimate of the statistical variance does not involve actually calculating the statistical variance; and
   comparing the calculated estimated statistical variance to a threshold amount to determine a status of the substrate.

16. The method of claim 15, further comprising determining the threshold amount by performing the measuring and calculating for a plurality of substrates to determine a plurality of respective estimated statistical variances, and wherein the comparing comprises comparing one of the respective estimated statistical variances to an average estimated statistical variance of the plurality of substrates.

17. The method of claim 16, further comprising calculating a confidence interval for each estimated statistical variance, and wherein the comparing further comprises adding and subtracting the confidence interval to the one of the respective estimated statistical variances to produce an estimated statistical variance range and comparing the estimated statistical variance range to the threshold amount.

18. The method of claim 15, further comprising:
   when the calculated estimated statistical variance exceeds the threshold amount, taking an action selected from the group consisting of: producing an alarm signal, changing a process variable, further inspecting a corresponding substrate or discarding the corresponding substrate.

19. The method of claim 15, wherein the positions measured correspond to positions of structures printed on the substrate.

20. The method of claim 19, wherein the structures comprise alignment marks.

* * * * *